(12) United States Patent
Han et al.

(10) Patent No.: US 12,538,694 B2
(45) Date of Patent: Jan. 27, 2026

(54) LIGHT-EMITTING PANEL AND MANUFACTURING METHOD THEREOF, AND LIGHT-EMITTING APPARATUS

(71) Applicant: BOE Technology Group Co., Ltd., Beijing (CN)

(72) Inventors: Cheng Han, Beijing (CN); Qixiao Wu, Beijing (CN); Songquan Wu, Beijing (CN); Xu Li, Beijing (CN); Yanming Wang, Beijing (CN); Xiangmin Wen, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 388 days.

(21) Appl. No.: 18/272,690

(22) PCT Filed: Sep. 28, 2022

(86) PCT No.: PCT/CN2022/121983
§ 371 (c)(1),
(2) Date: Jul. 17, 2023

(87) PCT Pub. No.: WO2024/065241
PCT Pub. Date: Apr. 4, 2024

(65) Prior Publication Data
US 2024/0397799 A1  Nov. 28, 2024

(51) Int. Cl.
*H10K 59/80* (2023.01)
*H10K 50/844* (2023.01)
(Continued)

(52) U.S. Cl.
CPC ....... *H10K 59/879* (2023.02); *H10K 59/1201* (2023.02); *H10K 59/126* (2023.02);
(Continued)

(58) Field of Classification Search
CPC ... H10K 59/8792; H10K 50/844; H10K 59/12
See application file for complete search history.

(56) References Cited

U.S. PATENT DOCUMENTS

| 2021/0175468 | A1  | 6/2021 | Lee |
| 2024/0016042 | A1* | 1/2024 | Zhang ................. H10K 59/879 |
| 2024/0268196 | A1* | 8/2024 | Shi ............................ G09F 9/30 |

FOREIGN PATENT DOCUMENTS

| CN | 113054136 A | 6/2021 |
| CN | 113193151 A | 7/2021 |

(Continued)

*Primary Examiner* — Joseph L Williams
(74) *Attorney, Agent, or Firm* — WHDA, LLP (57) ABSTRACT

A light-emitting panel and a manufacturing method thereof, and a light-emitting apparatus are provided, which relate to the technical field of photoelectric technology. The light-emitting panel includes: a light-emitting substrate including a light-emitting area and a non-light-emitting area surrounding the light-emitting area; a first packaging layer disposed at a light emitting side of the light-emitting substrate; a low refractive index layer disposed at a side of a first packaging layer away from the light-emitting substrate, the low refractive index layer being arranged around the light-emitting area; a high refractive index layer disposed at sides of the low refractive index layer and the first packaging layer away from the light-emitting substrate, an orthographic projection of the high refractive index layer on the light-emitting substrate covering the light-emitting area, and the high refractive index layer covering a side surface of the low refractive index layer facing the light-emitting area.

20 Claims, 4 Drawing Sheets

(51) Int. Cl.
  *H10K 59/12* (2023.01)
  *H10K 59/126* (2023.01)
  *H10K 59/35* (2023.01)
  *H10K 59/38* (2023.01)
  *H10K 59/40* (2023.01)

(52) U.S. Cl.
  CPC ........... *H10K 59/352* (2023.02); *H10K 59/38* (2023.02); *H10K 59/40* (2023.02); *H10K 59/8731* (2023.02)

(56) References Cited

FOREIGN PATENT DOCUMENTS

| CN | 113394351 A | 9/2021 |
| CN | 215578616 U | 1/2022 |
| CN | 114005861 A | 2/2022 |
| CN | 114864847 A | 8/2022 |
| CN | 114975826 A | 8/2022 |

* cited by examiner

LIGHT-EMITTING PANEL AND MANUFACTURING METHOD THEREOF, AND LIGHT-EMITTING APPARATUS

TECHNICAL FIELD

The present disclosure relates to the technical field of photoelectric technology and, more particularly, to a light-emitting panel and a manufacturing method thereof, and a light-emitting apparatus.

BACKGROUND

An organic light emitting diode (OLED) is an active light emitting device, which has advantages of self-emission, a wide viewing angle, a high contrast, low power consumption, a wide color gamut, thinness and an ability of being irregular-shaped.

SUMMARY

The present disclosure provides a light-emitting panel, including:
- a light-emitting substrate including a light-emitting area and a non-light-emitting area surrounding the light-emitting area;
- a first packaging layer disposed at a light emitting side of the light-emitting substrate;
- a low refractive index layer disposed at a side of the first packaging layer away from the light-emitting substrate, the low refractive index layer being arranged around the light-emitting area;
- a high refractive index layer disposed at sides of the low refractive index layer and the first packaging layer away from the light-emitting substrate, an orthographic projection of the high refractive index layer on the light-emitting substrate covering the light-emitting area, and the high refractive index layer covering a side surface of the low refractive index layer facing the light-emitting area; and
- a second packaging layer disposed at a side of the high refractive index layer away from the light-emitting substrate;
- wherein a refractive index of the high refractive index layer is greater than a refractive index of the low refractive index layer, and the side surface of the low refractive index layer facing the light-emitting area contacts with the high refractive index layer to form a first interface, and the first interface is configured for totally reflecting light emitted from the light-emitting area and incident through the high refractive index layer.

In some embodiments, an included angle between the first interface and a plane where the light-emitting substrate is located is a first included angle, the first included angle being greater than or equal to 50 degrees and less than or equal to 90 degrees and an opening of the first included angle facing away from the light-emitting area.

In some embodiments, a surface of a side of the high refractive index layer away from the light-emitting substrate is higher than a surface of a side of the low refractive index layer away from the light-emitting substrate, and the surface of the side of the high refractive index layer away from the light-emitting substrate is provided with a digging hole, an orthographic projection of the digging hole on the light-emitting substrate being located within an orthographic projection of the low refractive index layer on the light-emitting substrate;
wherein the refractive index of the second packaging layer is less than the refractive index of the high refractive index layer, and the second packaging layer fills the digging hole, so that the second packaging layer and a hole wall of the digging hole contact with each other to form a second interface.

In some embodiments, an included angle between the second interface and the plane where the light-emitting substrate is located is a second included angle, the second included angle being greater than or equal to 50 degrees and less than or equal to 130 degrees and an opening of the second included angle facing the light-emitting area.

In some embodiments, the light-emitting panel includes a red sub-pixel, a green sub-pixel and a blue sub-pixel, the high refractive index layer includes a first color film layer, and the first color film layer includes:
- a first red light transmission pattern located in the red sub-pixel for transmitting red light;
- a first green light transmission pattern located in the green sub-pixel for transmitting green light; and
- a first blue light transmission pattern located in the blue sub-pixel for transmitting blue light.

In some embodiments, the light-emitting panel further includes:
- a planarization layer disposed at the side of the first packaging layer away from the light-emitting substrate, the low refractive index layer and the first color film layer being both located at a side of the planarization layer away from the light-emitting substrate;
- wherein transmittance of the planarization layer is greater than or equal to transmittance of the first color film layer.

In some embodiments, the light-emitting panel further includes:
- a first light-shielding layer located between the planarization layer and the low refractive index layer, an orthographic projection of the first light-shielding layer on the light-emitting substrate being located within the non-light-emitting area, and the low refractive index layer covering a side surface of the first light-shielding layer facing the light-emitting area.

In some embodiments, an absolute value of difference between the refractive index of the first packaging layer and a refractive index of the planarization layer is less than or equal to 0.15, and an absolute value of difference between a refractive index of the first color film layer and the refractive index of the planarization layer is less than or equal to 0.15.

In some embodiments, the light-emitting panel includes a plurality of sub-pixels with different colors, and the high refractive index layer includes a transmission film layer, the transmission film layer being made of a same material in different color sub-pixels.

In some embodiments, the plurality of sub-pixels include a red sub-pixel, a green sub-pixel and a blue sub-pixel, and the light-emitting panel further includes:
- a second color film layer disposed between the transmission film layer and the second packaging layer, or at a side of the second packaging layer away from the light-emitting substrate; wherein the second color film layer includes:
- a second red light transmission pattern located in the red sub-pixel for transmitting red light;
- a second green light transmission pattern located in the green sub-pixel for transmitting green light; and a second blue light transmission pattern located in the blue sub-pixel for transmitting blue light.

In some embodiments, the light-emitting panel further includes:

a second light-shielding layer located between the first packaging layer and the low refractive index layer, an orthographic projection of the second light-shielding layer on the light-emitting substrate being located within the non-light-emitting area, and the low refractive index layer covering a side surface of the second light-shielding layer facing the light-emitting area.

In some embodiments, an absolute value of difference between the refractive index of the first packaging layer and a refractive index of the transmission film layer is less than or equal to 0.15.

In some embodiments, the light-emitting panel further includes:

a third packaging layer disposed at a side of the second packaging layer away from the light-emitting substrate;
wherein a material of the first packaging layer includes an inorganic material, a material of the second packaging layer includes an organic material, and a material of the third packaging layer includes an inorganic material.

In some embodiments, the light-emitting panel further includes:

a touch layer disposed at a side of the third packaging layer away from the light-emitting substrate; and
a cover plate disposed at a side of the touch layer away from the light-emitting substrate.

In some embodiments, the refractive index of the high refractive index layer is greater than or equal to 1.65 and less than or equal to 1.85; and/or the refractive index of the low refractive index layer is greater than or equal to 1.45 and less than or equal to 1.55.

In some embodiments, the high refractive index layer is made of at least one of: an organic matrix, zirconia, titanium oxide, a photosensitizer, a dye and a resin; and/or the low refractive index layer is made of at least one of: an organic material doped with photosensitive particles, silicon oxide, silicon nitride and silicon oxynitride.

In some embodiments, a thickness of the high refractive index layer is greater than or equal to 2 microns and less than or equal to 6 microns; and/or a thickness of the low refractive index layer is greater than or equal to 1 micron and less than or equal to 3 microns.

In some embodiments, the light-emitting substrate includes:

a light emitting device located in the light-emitting area, wherein the light emitting device includes an organic light-emitting diode, a quantum dot light-emitting diode, a mini light-emitting diode or a micro light-emitting diode.

The present disclosure provides a light-emitting apparatus, including:

the light-emitting panel according to any one of embodiments stated above;
a driving integrated circuit configured to provide a driving signal to the light-emitting panel; and
a power supply circuit configured to supply power to the light-emitting panel.

The present disclosure provides a manufacturing method of a light-emitting panel, including:

providing a light-emitting substrate, the light-emitting substrate including a light-emitting area and a non-light-emitting area surrounding the light-emitting area;
forming a first packaging layer at a light emitting side of the light-emitting substrate;
forming a low refractive index layer at a side of the first packaging layer away from the light-emitting substrate, the low refractive index layer being arranged around the light-emitting area;
forming a high refractive index layer at sides of the low refractive index layer and the first packaging layer away from the light-emitting substrate, an orthographic projection of the high refractive index layer on the light-emitting substrate covering the light-emitting area, and the high refractive index layer covering a side surface of the low refractive index layer facing the light-emitting area; and
forming a second packaging layer at a side of the high refractive index layer away from the light-emitting substrate;
wherein a refractive index of the high refractive index layer is greater than a refractive index of the low refractive index layer, and the side surface of the low refractive index layer facing the light-emitting area contacts with the high refractive index layer to form a first interface, and the first interface is configured for totally reflecting light emitted from the light-emitting area and incident through the high refractive index layer.

The above description is only a summary of technical schemes of the present disclosure, which can be implemented according to contents of the specification in order to better understand technical means of the present disclosure; and in order to make above and other objects, features and advantages of the present disclosure more obvious and understandable, detailed description of the present disclosure is particularly provided in the following.

BRIEF DESCRIPTION OF THE DRAWINGS

In order to more clearly illustrate the technical solutions of the embodiments of the present disclosure or the prior art, the figures that are required to describe the embodiments or the prior art may be briefly introduced below. Apparently, the figures that are described below are embodiments of the present disclosure, and a person skilled in the art can obtain other figures according to these figures without paying creative work. It should be noted that the proportions in the drawings are only indicative and do not represent actual proportions.

DETAILED DESCRIPTION

In order to make purposes, technical schemes and advantages of embodiments of this disclosure more clearer, the technical schemes in the embodiments of this disclosure will be described clearly and completely with reference to the drawings in the embodiments of this disclosure; and it is obvious that the described embodiments are part of the embodiments of this disclosure, but not all of them. On a basis of the embodiments in the present disclosure, all other embodiments obtained by the ordinary skilled in the art without paying creative effort are within a protection scope of this disclosure.

Figure 1:
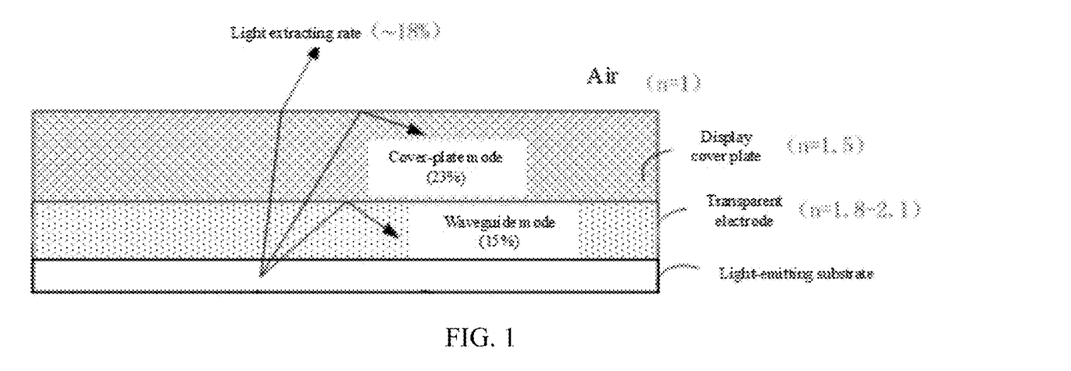
FIG. 1 schematically shows a schematic structural diagram of a section of a light-emitting panel in related art.

As shown in FIG. 1, light emitted by a light-emitting substrate passes through a plurality of film layers with different refractive indexes. When the light is emitted from a film with an high refractive index into a film with a low refractive index, light exiting originally at a squint angle may be totally reflected at an interface, thus light loss in various modes (such as a waveguide mode, a cover-plate mode, etc, shown in FIG. 1) is caused and light extraction efficiency is reduced.

Figure 2:
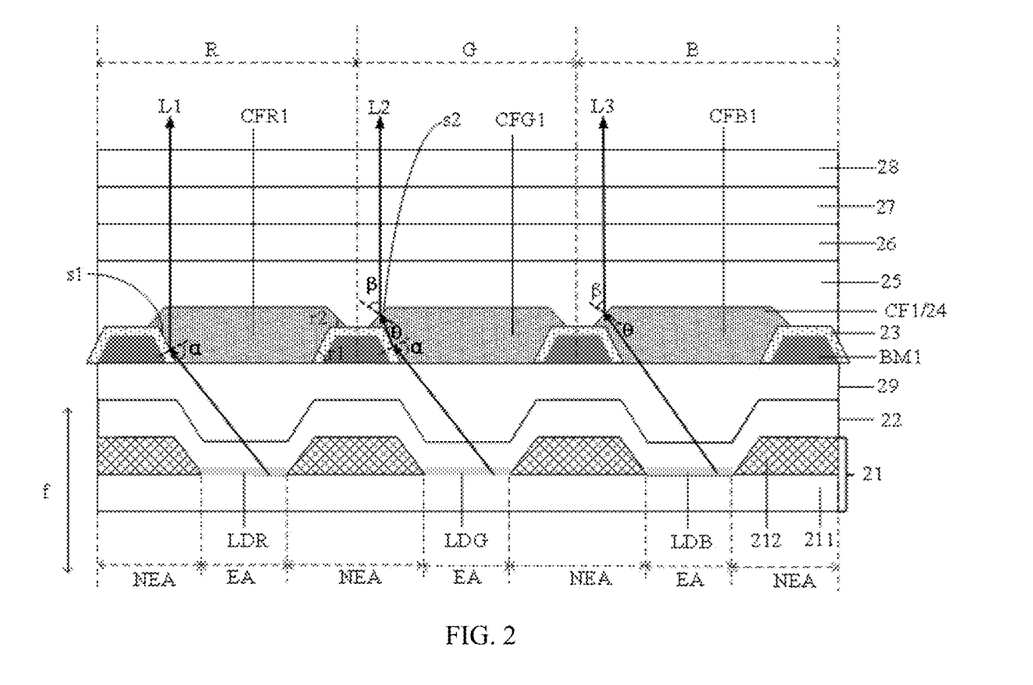
FIG. 2 schematically shows a schematic structural diagram of a section of a first type of the light-emitting panel according to the present disclosure.
Figure 3:
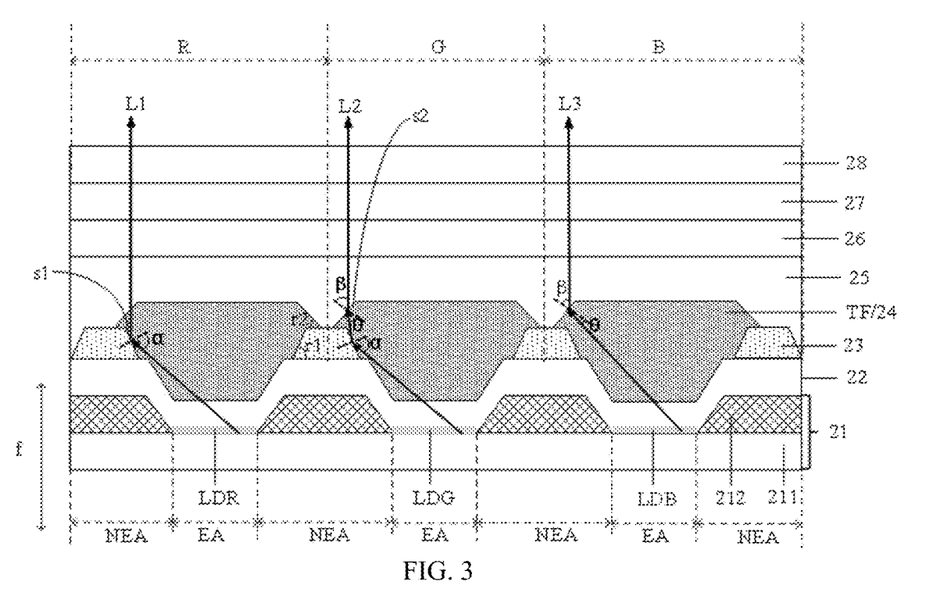
FIG. 3 schematically shows a schematic structural diagram of a section of a second type of the light-emitting panel according to the present disclosure.

A light-emitting panel is provided in the present disclosure, and reference is made to FIG. 2 and FIG. 3, which schematically shows schematic structural diagrams of sections of light-emitting panels according to the present disclosure, respectively. As shown in FIG. 2 or FIG. 3, the light-emitting panel includes: a light-emitting substrate 21 including a light-emitting area EA and a non-light-emitting area NEA surrounding the light-emitting area EA; a first packaging layer 22 disposed at a light emitting side of the light-emitting substrate 21; a low refractive index layer 23 disposed at a side of a first packaging layer 22 away from the light-emitting substrate 21, the low refractive index layer 23 being arranged around the light-emitting area EA; a high refractive index layer 24 disposed at sides of the low refractive index layer 23 and the first packaging layer 22 away from the light-emitting substrate 21, an orthographic projection of the high refractive index layer 24 on the light-emitting substrate 21 covering the light-emitting area EA, and the high refractive index layer 24 covering a side surface of the low refractive index layer 23 facing the light-emitting area EA; and a second packaging layer 25 disposed at a side of the high refractive index layer 24 away from the light-emitting substrate 21.

An refractive index of the high refractive index layer 24 is greater than an refractive index of the low refractive index layer 23, and the side surface of the low refractive index layer 23 facing the light-emitting area EA contacts with the high refractive index layer 24 to form a first interface s1, and the first interface s1 is configured for totally reflecting light emitted from the light-emitting area EA and incident through the high refractive index layer 24.

As shown in FIG. 2 or FIG. 3, for light incident at the first interface s1, the incident light may be totally reflected at the first interface s1 when an incident angle α is greater than or equal to a critical angle of total reflection, and a propagation direction of the totally reflected light (L1 in FIG. 2 or FIG. 3) is close to a normal direction f of the light-emitting substrate 21, so that an incident angle of the light at a subsequent film interface can be reduced, thus probability of total reflection of display light at a film interface is reduced, and the light extraction efficiency, especially front light extraction efficiency is improved.

The critical angle of total reflection is arcsin (n1/n2), and n1 is the refractive index of the low refractive index layer 23, and n2 is the refractive index of the high refractive index layer 24.

As shown in FIG. 2 or FIG. 3, because the first interface s1 can deflect the light exiting originally at the squint angle toward a direction at a positive viewing angle, and by arranging the first interface s1 between a plurality of packaging film layers, such as between the first packaging layer 22 and the second packaging layer 25, total reflection of the light at an interface between the first packaging layer 22 and the second packaging layer 25 can be avoided, and probability of total internal reflection of the light at the subsequent film layer interface (such as an interface between a cover plate 28 and air in FIG. 2 or FIG. 3) can be reduced, thereby the light extraction efficiency, especially the front light extraction efficiency is improved, and power consumption is reduced.

In addition, compared with a scheme in which the first interface s1 is arranged at a side of the second packaging layer 25 away from the light-emitting substrate 21, by arranging the first interface s1 between the first packaging layer 22 and the second packaging layer 25 in the present disclosure, a longitudinal distance between the first interface s1 and the light-emitting area EA (that is, a distance along a normal direction f of the light-emitting substrate 21) can be reduced, an incident angle α of light incident at the first interface s1 can be reduced, and a proportion of incident light meeting a total reflection condition can be reduced, so as to improve a problem of excessive brightness attenuation amplitude in a direction at the squint angle.

In some embodiments, a material of the first packaging layer 22 may include inorganic materials such as silicon oxynitride and silicon nitride. An orthographic projection of the first packaging layer 22 on the light-emitting substrate 21 covers a whole surface of the light-emitting substrate 21, and in this way, the light-emitting substrate 21 can be protected, and performance of the light-emitting substrate 21 can be prevented from being affected in a subsequent process of manufacturing the low refractive index layer 23 and the high refractive index layer 24.

In some embodiments, a material of the second packaging layer 25 may include organic materials such as acrylate polymers or may include inorganic materials, which is not limited in the present disclosure. An orthographic projection of the second packaging layer 25 on the light-emitting substrate 21 covers a whole surface of the light-emitting substrate 21.

Figure 5:
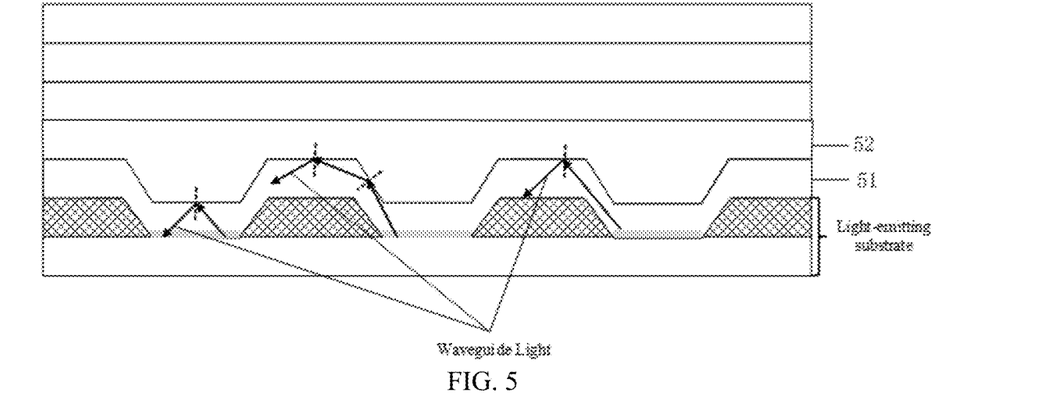
FIG. 5 schematically shows a schematic diagram of waveguide light loss occurring in a light-emitting panel in related art.

Reference is made to FIG. 5, which shows a schematic structural diagram of a light-emitting panel in related art. In FIG. 5, light emitted by the light-emitting substrate passes through a high-refraction packaging layer 51 and enters a low-refraction packaging layer 52. Because there is no first interface s1 arranged between the high-refraction packaging layer 51 and the low-refraction packaging layer 52, a part of the light is totally internally reflected at an interface between the high-refraction packaging layer 51 and the low-refraction packaging layer 52, and cannot exit the high-refraction packaging layer 51, resulting in large amount of waveguide light loss.

In some embodiments, a refractive index of the first packaging layer 22 may be greater than a refractive index of the second packaging layer 25. In this way, the low refractive index layer 23 and high refractive index layer 24 which are arranged in layer configuration can separate the first packaging layer 22 with a large refractive index from the second packaging layer 25 with a small refractive index, and the first interface s1 formed by the high refractive index layer 24 and the low refractive index layer 23 can deflect waveguide light that originally could not be exited toward the direction at the positive viewing angle and emit it, thus light loss caused by total internal reflection is effectively reduced and the light extraction efficiency is improved.

In some embodiments, as shown in FIG. 2 or FIG. 3, an included angle between the first interface s1 and a plane where the light-emitting substrate 21 is located is a first included angle r1, which is greater than or equal to 50 degrees and less than or equal to 90 degrees, and an opening of the first included angle r1 faces away from the light-emitting area EA.

In some embodiments, as shown in FIG. 2 or FIG. 3, a surface of a side of the high refractive index layer 24 away from the light-emitting substrate 21 is higher than a surface of a side of the low refractive index layer 23 away from the light-emitting substrate 21, and the surface of the side of the high refractive index layer 24 away from the light-emitting substrate 21 is provided with a digging hole, and an orthographic projection of the digging hole on the light-emitting substrate 21 is located within an orthographic projection of the low refractive index layer 23 on the light-emitting substrate 21. Further, the orthographic projection of the digging hole on the light-emitting substrate 21 can be located within the non-light-emitting area NEA (as shown in FIG. 2 or FIG. 3).

The refractive index of the second packaging layer 25 is less than the refractive index of the high refractive index layer 24, and the second packaging layer 25 fills the digging hole, so that the second packaging layer 25 and a hole wall of the digging hole contact with each other to form a second interface s2.

As shown in FIG. 2 or FIG. 3, light incident at the second interface s2 from the high refractive index layer 24 may be refracted. Since the refractive index of the second packaging layer 25 is less than the refractive index of the high refractive index layer 24, a refractive angle β is greater than an incident angle θ, so that refracted light (L2 and L3 as shown in FIG. 2 or 3) entering the second packaging layer 25 through the second interface s2 is closer to the normal direction f of the light-emitting substrate 21, thereby the front light extraction efficiency is further improved.

Since the refractive index of the second packaging layer 25 is less than the refractive index of the high refractive index layer 24, light incident at the second interface s2 from the high refractive index layer 24 may also be totally reflected, so that light that meets the total reflection condition and originally exits at the squint angle is deflected toward the direction at the positive viewing angle, thereby the front light extraction efficiency is further improved.

In specific implementation, an angle of the second interface s2 can be adjusted by adjusting a slope angle of the hole wall, so as to adjust a proportion of refraction or total reflection of light incident at the second interface s2 from the high refractive index layer 24.

In some embodiments, as shown in FIG. 2 or FIG. 3, an included angle between the second interface s2 and the plane where the light-emitting substrate 21 is located (that is, the slope angle of the hole wall) is a second included angle r2, and the second included angle r2 is greater than or equal to 50 degrees and less than or equal to 130 degrees, and an opening of the second included angle r2 faces the light-emitting area EA.

In specific implementation, the digging hole can run through (as shown in FIG. 2 and FIG. 3) or partially run through the high refractive index layer 24 in a normal direction f of the light-emitting substrate 21.

It should be noted that the surface of the side of the high refractive index layer 24 away from the light-emitting substrate 21 can be provided with no digging hole, for example, the surface of the side of the high refractive index layer 24 away from the light-emitting substrate 21 can be a flat surface, thus process difficulty is reduced and influence of a patterning process on the performance of the light-emitting substrate is avoided.

In some embodiments, as shown in FIG. 2 or FIG. 3, the light-emitting panel may further include a third packaging layer 26 disposed at a side of the second packaging layer 25 away from the light-emitting substrate 21, and an orthographic projection of the third packaging layer 26 on the light-emitting substrate 21 covers a whole surface of the light-emitting substrate 21.

In some embodiments, a material of the third packaging layer 26 includes inorganic materials such as silicon oxynitride and silicon nitride.

In some embodiments, as shown in FIG. 2 or FIG. 3, the light-emitting panel may further include a touch layer 27 disposed at a side of the third packaging layer 26 away from the light-emitting substrate 21. The touch layer 27 is used to realize a touch function of the light-emitting panel.

In some embodiments, as shown in FIG. 2 or FIG. 3, the light-emitting panel may further include a cover plate 28 disposed at a side of the touch layer 27 away from the light-emitting substrate 21. A material of the cover plate 28 may include, for example, transparent polyimide or glass, which is not limited in the present disclosure.

Figure 8:
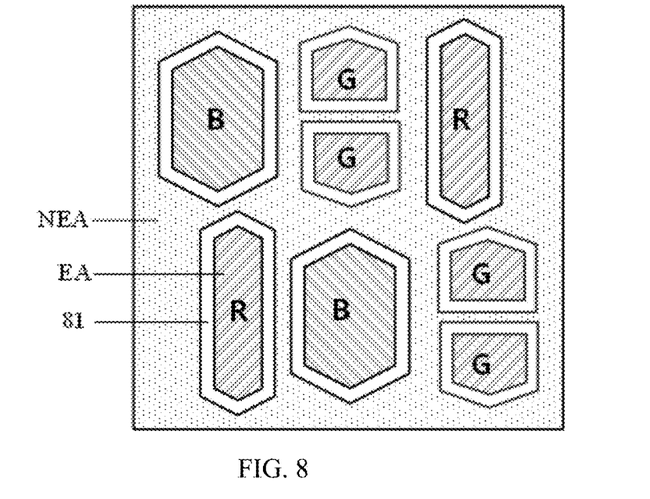
FIG. 8 schematically shows a schematic planar structural diagram of a light-emitting panel according to the present disclosure.

In some embodiments, the light-emitting panel includes a plurality of sub-pixels with a same color or different colors. For example, referring to FIG. 8, the plurality of sub-pixels may include a red sub-pixel R, a green sub-pixel G, and a blue sub-pixel B. Arrangement modes of the red sub-pixel R, the green sub-pixel G and the blue sub-pixel B within one pixel include but are not limited to GGRB pixel arrangement (as shown in FIG. 8), RGB pixel arrangement, Real RGB pixel arrangement, Diamond pixel arrangement, diamond-like pixel arrangement and the like.

In the following, the high refractive index layer 24 will be illustratively described with reference to FIG. 2 and FIG. 3.

In a first example, the high refractive index layer 24 is made of different materials in different color sub-pixels. As shown in FIG. 2, the high refractive index layer 24 is a first color film layer CF1, the first color film layer CF1 includes a first red light transmission pattern CFR1 located in the red sub-pixel R for transmitting red light; a first green light transmission pattern CFG1 located in the green sub-pixel G for transmitting green light; and a first blue light transmission pattern CFB1 located in the blue sub-pixel B for transmitting blue light.

In the present disclosure, because the first color film layer CF1 can only transmit incident light in a specific wavelength range (referring to FIG. 7), and by setting the high refractive index layer 24 as the first color film layer CF1, reflection of ambient light by the light-emitting panel can be reduced, so that a polarizer may be replaced, which facilitates realization of low power consumption and flexible display.

As shown in FIG. 2, the light-emitting panel may further include a planarization layer 29 disposed at a side of the first packaging layer 22 away from the light-emitting substrate 21, and both the low refractive index layer 23 and the first color film layer CF1 are located at a side of the planarization layer 29 away from the light-emitting substrate 21. The transmittance of the planarization layer 29 may be greater than or equal to the transmittance of the first color film layer CF1.

By arranging the planarization layer 29 with the high transmittance between the first color film layer CF1 and the first packaging layer 22, the first color film layer CF1 is replaced with the planarization layer 29 with the high transmittance to fill an opening area (i.e., the light-emitting area EA) in the light-emitting substrate 21, so that the light extraction efficiency can be further improved.

Figure 6:
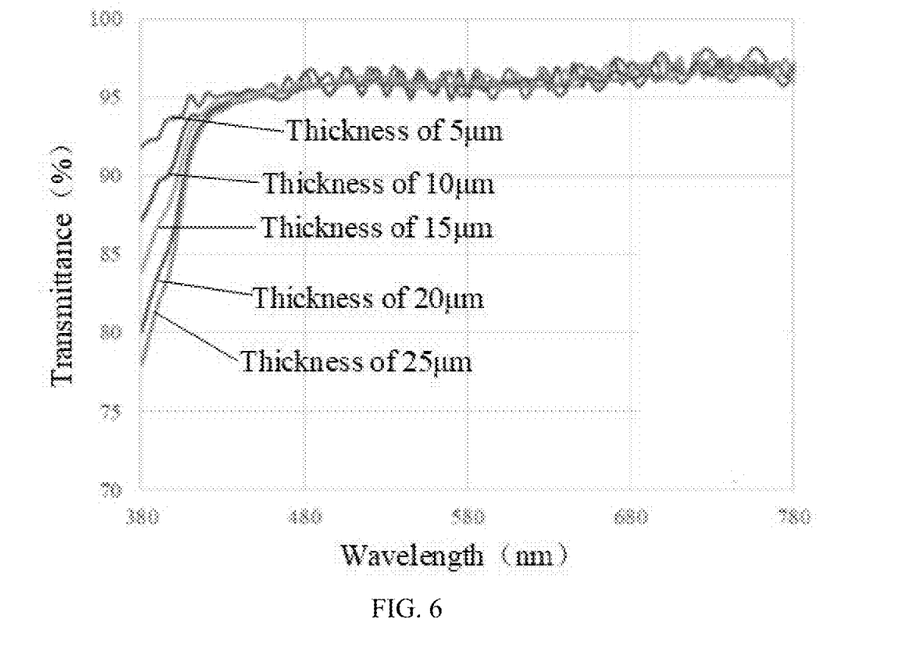
FIG. 6 schematically shows transmittance curves of planarization layers or transmission films with several different thicknesses in a visible light range.
Figure 7:
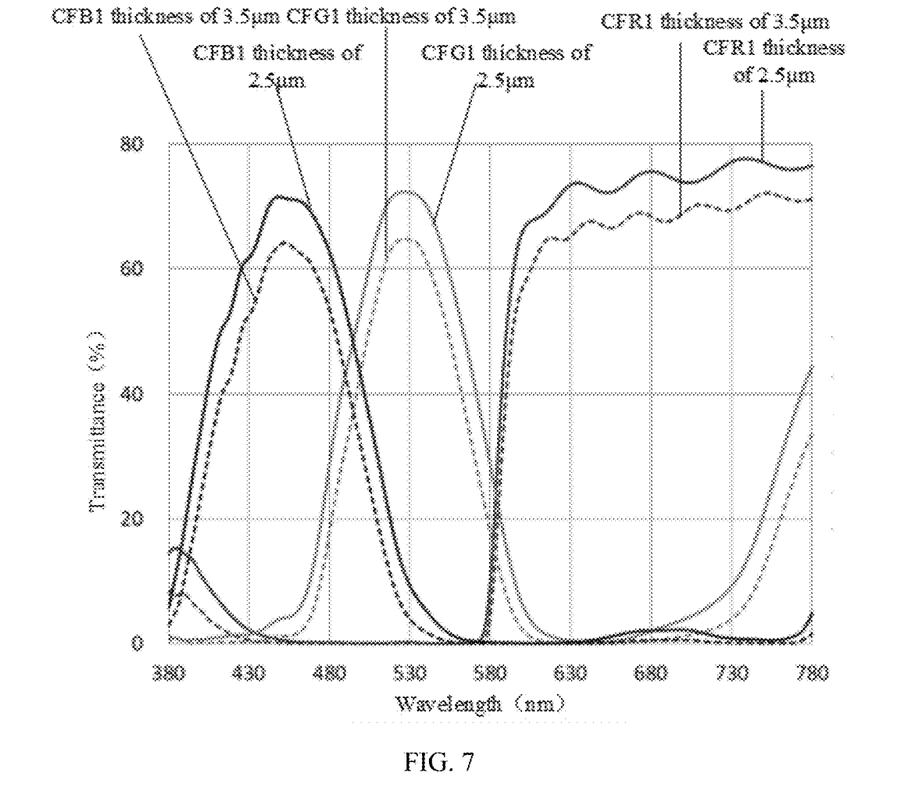
FIG. 7 schematically shows transmittance curves of first red light transmission patterns, first green light transmission patterns and first blue light transmission patterns with several different thicknesses in the visible range.

The planarization layer 29 can include an organic matrix, zirconia or titanium oxide inorganic nanoparticles and a photosensitizer, and the transmittance of planarization layers 29 with several different thicknesses in a visible light range is shown in FIG. 6. The first color film layer CF1 may include chemical dyes and resins, and the transmittance of the first red light transmission pattern CFR1, the first green light transmission pattern CFG1 and the first blue light transmission pattern CFB1 with different thicknesses in the first color film layer CF1 in the visible light range is shown in FIG. 7. As can be seen from FIG. 6 and FIG. 7, the transmittance of the planarization layer 29 to the visible light can reach about 95%, while the transmittance of the first color film layer CF1 is lower than 80%, which is much lower than the transmittance of the planarization layer 29.

As shown in FIG. 2, an orthographic projection of the planarization layer 29 on the light-emitting substrate 21 covers a whole surface of the light-emitting substrate 21.

As shown in FIG. 2, the light-emitting panel may further include a first light-shielding layer BM1, which is located between the planarization layer 29 and the low refractive index layer 23. An orthographic projection of the first light-shielding layer BM1 on the light-emitting substrate 21 is located within the non-light-emitting area NEA, and the low refractive index layer 23 covers a side surface of the first light-shielding layer BM1 facing the light-emitting area EA.

Because the first light-shielding layer BM1 can absorb the incident light, reflection of the ambient light by the light-emitting panel can be further reduced by disposing the first light-shielding layer BM1.

In addition, compared with a scheme in which the first light-shielding layer BM1 is arranged at a side of the second packaging layer 25 away from the light-emitting substrate 21, in the present disclosure, by arranging the first light-shielding layer BM1 between the first packaging layer 22 and the second packaging layer 25, a longitudinal distance between the first light-shielding layer BM1 and the light-emitting area EA (that is, a distance along the normal direction f of the light-emitting substrate 21) can be reduced, and only light exiting at a larger viewing angle can be incident on the first light-shielding layer BM1 so as to be absorbed and this light is of a relatively low proportion, which can improve the light extraction efficiency on the one hand and further may improve the problem of excessive brightness attenuation amplitude in the direction at the squint angle.

In FIG. 2, the low refractive index layer 23 covers the entire first light-shielding layer BM1, which is not limited in the present disclosure.

In the present disclosure, an absolute value of difference between the refractive index of the first packaging layer 22 and a refractive index of the planarization layer 29 is less than or equal to 0.15, and an absolute value of difference between a refractive index of the first color film layer CF1 and the refractive index of the planarization layer 29 is less than or equal to 0.15.

Because the refractive indices of the first packaging layer 22, the planarization layer 29 and the first color film layer CF1 are relatively close to each other, light loss at an interface between the first packaging layer 22 and the planarization layer 29 and an interface between the planarization layer 29 and the first color film layer CF1 is less, and most of light exiting from the first packaging layer 22 can enter the planarization layer 29 and the first color film layer CF1, so the light extraction efficiency can be further improved.

Illustratively, the refractive index of the first packaging layer 22 is greater than or equal to 1.75 and less than or equal to 1.85, which is not limited in the present disclosure.

Illustratively, the refractive index of the planarization layer 29 is greater than or equal to 1.7 and less than or equal to 1.8, which is not limited in the present disclosure.

Illustratively, the refractive index of the first color film layer CF1 is greater than or equal to 1.65 and less than or equal to 1.8, which is not limited in the present disclosure.

In a second embodiment, as shown in FIG. 3, the high refractive index layer 24 is a transmission film layer TF, and the transmission film layer TF is made of a same material in different color sub-pixels. That is, the transmission film layer TF is made of a same material in the red sub-pixel R, the green sub-pixel G and the blue sub-pixel B.

The transmission film layer TF can include an organic matrix, zirconia or titanium oxide inorganic nanoparticles and a photosensitizer. The transmittance of transmission film layers TF with several different thicknesses in the visible light range is as shown in FIG. 6, and the transmittance of this transmission film layer TF for light with several wavelengths in the visible light range is basically the same, which is about 95%. By setting the high refractive index layer 24 as the transmission film layer TF, the light extraction efficiency of the display panel can be improved.

Figure 4:
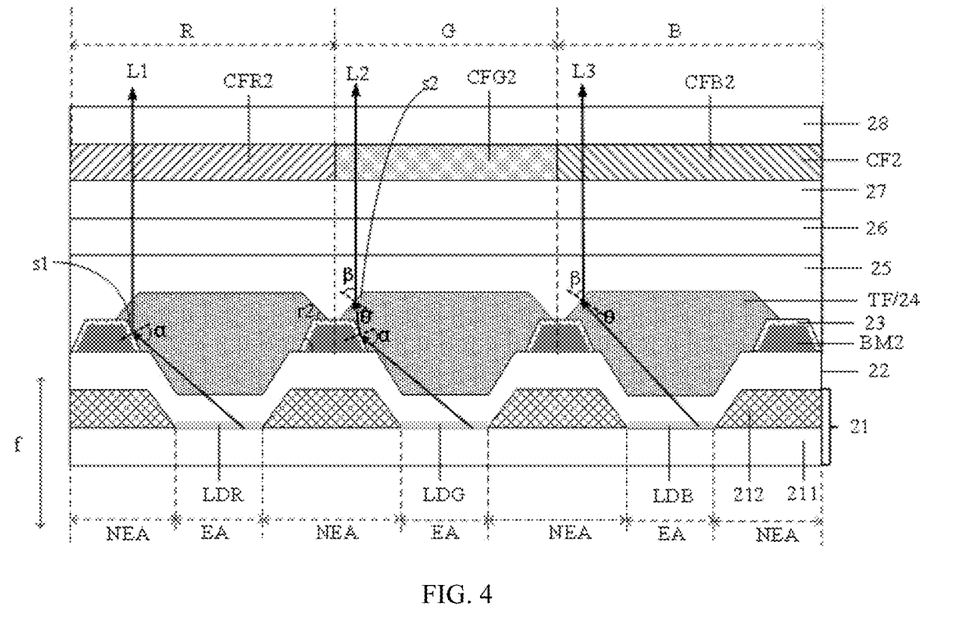
FIG. 4 schematically shows a schematic structural diagram of a section of a third type of the light-emitting panel according to the present disclosure.

Further, in order to reduce reflection of the ambient light by the light-emitting panel, referring to FIG. 4, the light-emitting panel may further include a second color film layer CF2. The second color film layer CF2 may be arranged between the transmission film layer TF and the second packaging layer 25, or at a side of the second packaging layer 25 away from the light-emitting substrate 21.

Illustratively, the second color film layer CF2 can be arranged between the touch layer 27 and the cover plate 28 (as shown in FIG. 4) or between the third packaging layer 26 and the touch layer 27, and in this way, the second color film layer CF2 can be prepared after the first packaging layer 22, the second packaging layer 25 and the third packaging layer 26, the influence of a preparation process of the second color film layer CF2 on performance of the light-emitting substrate 21 is reduced.

As shown in FIG. 4, the second color film layer CF2 may include a second red light transmission pattern CFR2 located in the red sub-pixel for transmitting red light; a second green light transmission pattern CFG2 located in the green sub-pixel for transmitting green light; and a second blue light transmission pattern CFB2 located in the blue sub-pixel for transmitting blue light.

In specific implementation, the second color film layer CF2 may include chemical dyes and resins.

In the present disclosure, because the second color film layer CF2 can only transmit incident light in a specific wavelength range, and by setting the second color film layer CF2 in the light-emitting panel, reflection of the ambient light by the light-emitting panel can be reduced, so that a polarizer may be replaced, which facilitates the realization of low power consumption and flexible display.

As shown in FIG. 4, the light-emitting panel may further include a second light-shielding layer BM2, which is located between the first packaging layer 22 and the low refractive index layer 23. An orthographic projection of the second light-shielding layer BM2 on the light-emitting substrate 21 is located within the non-light-emitting area NEA, and the low refractive index layer 23 covers a side surface of the second light-shielding layer BM2 facing the light-emitting area EA.

Because the second light-shielding layer BM2 can absorb the incident light, reflection of the ambient light by the light-emitting panel can be further reduced by disposing the second light-shielding layer BM2. In addition, compared with a scheme in which the second light-shielding layer BM2 is arranged at a side of the second packaging layer 25 away from the light-emitting substrate 21, in the present disclosure, by arranging the second light-shielding layer BM2 between the first packaging layer 22 and the second packaging layer 25, a longitudinal distance between the second light-shielding layer BM2 and the light-emitting area EA (that is, a distance along the normal direction f of the light-emitting substrate 21) can be reduced, and only light exiting at a larger viewing angle can be incident on the second light-shielding layer BM2 so as to be absorbed and this light is of a relatively low proportion, which can improve the light extraction efficiency on the one hand and further improve the problem of excessive brightness attenuation amplitude in a direction at the squint angle.

In FIG. 4, the low refractive index layer 23 covers the entire second light-shielding layer BM2, which is not limited in the present disclosure.

It should be noted that the second light-shielding layer BM2 can also be arranged at the side of the third packaging layer 26 away from the light-emitting substrate 21, so that the influence of a preparation process of the second light-shielding layer BM2 on performance of the light-emitting substrate 21 can be reduced.

In the present disclosure, an absolute value of difference between the refractive index of the first packaging layer 22 and the refractive index of the transmission film layer TF is less than or equal to 0.15. In this way, because the refractive indices of the first packaging layer 22 and the transmission film layer TF are relatively close to each other, light loss at an interface between the first packaging layer 22 and the transmission film layer TF is less, and most of light exiting from the first packaging layer 22 can enter the transmission film layer TF, so the light extraction efficiency can be further improved.

Illustratively, the refractive index of the first packaging layer 22 is greater than or equal to 1.75 and less than or equal to 1.85, which is not limited in the present disclosure.

Illustratively, the refractive index of the transmission film layer TF is greater than or equal to 1.7 and less than or equal to 1.8, which is not limited in the present disclosure.

In specific implementation, a polarizer may be attached to the side of the third packaging layer 26 away from the light-emitting substrate 21 to reduce the reflection of the ambient light by the light-emitting panel. However, a thickness of polarizer is generally 50 to 150 microns, which is relatively thick and with poor bending property, and repeated bending may result in obvious creases, and curling of screens cannot be realized, which greatly limits an application range of light-emitting panels. In addition, the transmittance of the polarizer is relatively poor, generally at a level of 38% to 46%, which is not conducive to the realization of low power consumption and long life of light-emitting devices.

In the present disclosure, by disposing the first color film layer CF1 and the first light-shielding layer BM1 (as shown in FIG. 2) or the second color film layer CF2 and the second light-shielding layer BM2 (as shown in FIG. 4) to replace the polarizer, requirements of low power consumption and flexible display can be met.

In some embodiments, the refractive index of the high refractive index layer 24 is greater than or equal to 1.65 and less than or equal to 1.85, which is not limited in the present disclosure.

In some embodiments, the refractive index of the low refractive index layer 23 is greater than or equal to 1.45 and less than or equal to 1.55, which is not limited in the present disclosure.

In some embodiments, the refractive index of the second packaging layer 25 is greater than or equal to 1.43 and less than or equal to 1.53, which is not limited in the present disclosure.

In some embodiments, the high refractive index layer 24 can be made of at least one of: an organic matrix, zirconia, titanium oxide, a photosensitizer, a dye, a resin, etc., which is not limited in the present disclosure.

In some embodiments, the low refractive index layer 23 can be made of at least one of: an organic material doped with photosensitive particles, silicon oxide, silicon nitride, silicon oxynitride, etc., which is not limited in the present disclosure.

In some embodiments, a thickness of the high refractive index layer 24 is greater than or equal to 2 microns and less than or equal to 6 microns, which is not limited in the present disclosure.

In some embodiments, a thickness of the low refractive index layer 23 is greater than or equal to 1 micron and less than or equal to 3 microns, which is not limited in the present disclosure.

In some embodiments, the light-emitting substrate 21 includes a light-emitting device located in the light-emitting area EA and including an organic light-emitting diode (OLED), a quantum dot light-emitting diode (QLED), a mini light-emitting diode (Mini LED) or a micro light-emitting diode (Micro LED), etc., which is not limited in the present disclosure.

As shown in FIG. 2 or FIG. 3, the light-emitting substrate 21 may include a base substrate 211, and a pixel definition layer 212 disposed at a side of the base substrate 211. The pixel definition layer 212 is configured to define an opening area for forming a plurality of sub-pixels, and the opening area is configured for disposing light emitting devices.

Illustratively, as shown in FIG. 2 or FIG. 3, an opening area of the red sub-pixel R is provided with a red light emitting device LDR, an opening area of the green sub-pixel G is provided with a green light emitting device LDG, and an opening area of the blue sub-pixel B is provided with a blue light emitting device LDB.

For OLED light-emitting devices, which can include an anode, a cathode and an organic light-emitting layer located between the anode and the cathode. Holes are injected into the organic light-emitting layer from an anode side, and electrons are injected into the organic light-emitting layer from a cathode side. Finally, the holes and electrons recombine in the organic light-emitting layer to generate excitons. When the generated excitons relax from an excited state to a ground state, the OLED light-emitting device emits light.

Referring to FIG. 8, a projection diagram of the first interface s1 on the light-emitting substrate 21 is schematically shown. As shown in FIG. 8, an orthographic projection of the first interface s1 on the light-emitting substrate 21 is of an annular structure 81 surrounding the light-emitting area EA, and an inner edge of the annular structure 81 (i.e., an edge of the annular structure close to the light-emitting area EA) extends outwardly by −1 micron to 5 microns relative to the edge of the light-emitting area EA, and in FIG. 8, the inner edge of the annular structure 81 coincides with an edge of the light-emitting area EA.

A light-emitting apparatus is further provided in the present disclosure, which includes: the light-emitting panel provided according to any one of the embodiments; a driving integrated circuit configured to provide a driving signal to the light-emitting panel; and a power supply circuit configured to supply power to the light-emitting panel.

Those skilled in the art can understand that the light-emitting apparatus has advantages of the light-emitting panel described above.

The light-emitting apparatus can be a display or a product containing the display. The display can be a flat panel display (FPD), a micro display, etc. The display can be divided to be a transparent display or an opaque display according to a scenario where the user can or cannot see a back of the display. The display can be divided to be a flexible display or an ordinary display (which can be called a rigid display) according to a scenario where the display can or cannot be bent or curled. Illustratively, the product containing the display can include a computer, a television, a billboard, a laser printer with display functions, a telephone, a mobile phone, an electronic paper, a personal digital assistant (PDA), a laptop computer, a digital camera, a tablet computer, a notebook computer, a navigator, a portable camcorder, a viewfinder, a vehicle, a large-area wall, a screen of a theater or a stadium sign, etc.

A manufacturing method of a light-emitting panel is further provided in present disclosure, referring to FIG. 2 or FIG. 3, the manufacturing method includes steps S01 to S05.

Step S01, a light-emitting substrate 21 is provided, the light-emitting substrate 21
includes a light-emitting area EA and a non-light-emitting area NEA surrounding the light-emitting area EA.

Step S02: a first packaging layer 22 is formed at a light emitting side of the light-emitting substrate 21.

Step S03: a low refractive index layer 23 is formed at a side of the first packaging layer 22 away from the light-emitting substrate 21, and the low refractive index layer 23 is arranged around the light-emitting area EA.

Step S04: a high refractive index layer 24 is formed at sides of the low refractive index layer 23 and the first packaging layer 22 away from the light-emitting substrate 21. An orthographic projection of the high refractive index layer 24 on the light-emitting substrate 21 covers the light-emitting area EA, and the high refractive index layer 24 covers a side surface of the low refractive index layer 23 facing the light-emitting area EA.

Step S05: a second packaging layer 25 is formed at a side of the high refractive index layer 24 away from the light-emitting substrate 21.

An refractive index of the high refractive index layer 24 is greater than an refractive index of the low refractive index layer 23, and the side surface of the low refractive index layer 23 facing the light-emitting area EA contacts with the high refractive index layer 24 to form a first interface s1, and the first interface s1 is configured for totally reflecting light emitted from the light-emitting area EA and incident through the high refractive index layer 24.

The light-emitting panel according to any one of the above embodiments can be prepared by the manufacturing method according to the present disclosure.

In some embodiments, the light-emitting panel shown in FIG. 2 can be prepared by the following steps S11 to S19.

Step S11, a pixel definition layer 212 and an organic light-emitting layer are sequentially prepared on the base substrate 211 to obtain the light-emitting substrate 21. Opening areas of a plurality of sub-pixels (corresponding to the light-emitting area EA) can be formed on the pixel definition layer 212 by exposure and development, and the organic light-emitting layer is prepared by evaporation and a material of the organic light-emitting layer includes a small molecular organic material, and the organic light-emitting layer is located in the opening areas.

Step S12, a first packaging layer 22 is prepared at a side of the light-emitting substrate 21 away from the base substrate 211. The first packaging layer 22 is prepared by plasma chemical vapor deposition, and a material of the first packaging layer 22 includes an inorganic material such as silicon oxynitride and silicon nitride.

Step S13, a planarization layer 29 is prepared at a side of the first packaging layer 22 away from the base substrate 211. The planarization layer 29 is prepared by coating and ultraviolet curing. A material of the planarization layer 29 includes an organic matrix, inorganic nanoparticles such as zirconia or titanium oxide, and a photosensitizer, and a coating thickness of the planarization layer is greater than or equal to 2 microns and less than or equal to 5 um.

Step S14, a first light-shielding layer BM1 is prepared at a side of the planarization layer 29 away from the base substrate 211, and is prepared by coating, and exposure and development. A material of the first light-shielding layer BM1 includes a metal chromium film and a black resin, with a coating thickness greater than or equal to 1 micron and less than or equal to 3 um.

Step S15, a low refractive index layer 23 is prepared at sides of the first light-shielding layer BM1 and the planarization layer 29 away from the base substrate 211.

The low refractive index layer 23 can made in a manufacturing method 1 as follows. A layer of organic glue is coated on the first light-shielding layer BM1 and the planarization layer 29, and then the organic glue corresponding to the opening areas is removed by an exposure and development process, so as to obtain the low refractive index layer 23 covering on the first light-shielding layer BM1. The organic glue can include an organic material, a photosensitizer and the like.

The low refractive index layer 23 can made in a manufacturing method 2 as follows. A silicon oxide layer is deposited on the first light-shielding layer BM1 and the planarization layer 29 by plasma chemical vapor deposition, and then the silicon oxide layer corresponding to the opening areas is removed by a plasma dry etching process, so as to obtain the low refractive index layer 23 covering on the first light-shielding layer BM1.

Step S16, a first color film layer CF1 (i.e., a high refractive index layer 24) is prepared at sides of the low refractive index layer 23 and the planarization layer 29 away from the base substrate 211, and is prepared by coating, and exposure and development. A material of the first color film layer CF1 includes chemical dyes and resins, with a coating thickness greater than or equal to 2 microns and less than or equal to 4 um.

Step S17, a second packaging layer 25 is prepared at sides of the first color film layer CF1 and the low refractive index layer 23 away from the base substrate 211, and is prepared by ink-jet printing, and a material of the second packaging layer 25 includes an organic material such as acrylate polymer.

In step S18, a third packaging layer 26 is prepared at a side of the second packaging layer 25 away from the base substrate 211, and is prepared by plasma chemical vapor deposition, and a material of the third packaging layer 26 includes an inorganic material such as silicon oxynitride and silicon nitride.

Step S19, a touch layer 27 and a glass cover plate are sequentially prepared at a side of the third packaging layer 26 away from the base substrate 211 so as to obtain the light-emitting panel as shown in FIG. 2.

In some embodiments, the light-emitting panel shown in FIG. 4 can be prepared by the following steps S21 to S28.

Step S21, a pixel definition layer 212 and an organic light-emitting layer are sequentially prepared on the base substrate 211 to obtain the light-emitting substrate 21. Opening areas of a plurality of sub-pixels (corresponding to the light-emitting area EA) can be formed on the pixel definition layer 212 by exposure and development, and the organic light-emitting layer is prepared by evaporation and a material of the organic light-emitting layer includes a small molecular organic material, and the organic light-emitting layer is located in the opening areas.

Step S22, a first packaging layer 22 is prepared at a side of the light-emitting substrate 21 away from the base substrate 211. The first packaging layer 22 is prepared by plasma chemical vapor deposition, and a material of the first packaging layer 22 includes an inorganic material such as silicon oxynitride and silicon nitride.

Step S23, a second light-shielding layer BM2 is prepared at a side of the first packaging layer 22 away from the base substrate 211, and is prepared by coating, and exposure and development. A material of the second light-shielding layer BM2 includes a metal chromium film and a black resin, with a coating thickness greater than or equal to 1 micron and less than or equal to 3 um.

Step S24, a low refractive index layer 23 is prepared at sides of the second light-shielding layer BM2 and the first packaging layer 22 away from the base substrate 211.

The low refractive index layer 23 can made in a manufacturing method 1 as follows. A layer of organic glue is coated on the second light-shielding layer BM2 and the first packaging layer 22, and then the organic glue corresponding to the opening areas is removed by an exposure and development process, so as to obtain the low refractive index layer 23 covering on the second light-shielding layer BM2. The organic glue can include an organic material, a photosensitizer and the like.

The low refractive index layer 23 can made in a manufacturing method 2 as follows. A silicon oxide layer is deposited on the second light-shielding layer BM2 and the first packaging layer 22 by plasma chemical vapor deposition, and then the silicon oxide layer corresponding to the opening areas is removed by a plasma dry etching process, so as to obtain the low refractive index layer 23 covering on the second light-shielding layer BM2.

Step S25, a transmission film layer TF (i.e., a high refractive index layer 24) is prepared at sides of the low refractive index layer 23 and the first packaging layer 22 away from the base substrate 211, and is prepared by coating, and exposure and development. A material of the transmission film layer TF includes an organic matrix, zirconia or titanium oxide inorganic nanoparticles and a photosensitizer, with a coating thickness greater than or equal to 3 microns and less than or equal to 6 um.

Step S26, a second packaging layer 25 is prepared at sides of the transmission film layer TF and the low refractive index layer 23 away from the base substrate 211, and is prepared by ink-jet printing, and a material of the second packaging layer 25 includes an organic material such as acrylate polymer.

Step S27, a third packaging layer 26 is prepared at a side of the second packaging layer 25 away from the base substrate 211, and is prepared by plasma chemical vapor deposition, and a material of the third packaging layer 26 includes an inorganic material such as silicon oxynitride and silicon nitride.

Step S28, a touch layer 27, a second color film layer CF2 and a glass cover plate 28 are sequentially prepared at a side of the third packaging layer 26 away from the base substrate 211 so as to obtain the light-emitting panel as shown in FIG. 4. The second color film layer CF2 is prepared by coating, and exposure and development. A material of the second color film layer CF2 includes chemical dyes and resins, with a coating thickness greater than or equal to 2 microns and less than or equal to 4 um.

In the description of the present disclosure, the meaning of "a plurality of" is two or more than two, and the meaning of "at least one" means one or more, unless otherwise specifically defined.

In the present disclosure, the orientation or positional relationship indicated by the terms "upper" and "lower" is based on the orientation or positional relationship shown in the drawings, only for the convenience of describing the present disclosure and simplifying the description, and does and not indicate or imply that the indicated device or element must have a specific orientation, or be constructed and operated in a specific orientation. Therefore, the terms should not be construed as limiting the present disclosure.

In the claims, any reference signs between parentheses should not be construed as limiting the claims.

Relational terms herein such as first and second, etc., are used merely to distinguish one entity or operation from another entity or operation, and do not necessarily require or imply there is any such relationship or order between these entities or operations. Furthermore, the terms "including", "including" or any variations thereof are intended to embrace a non-exclusive inclusion, such that a process, method, article, or terminal device including a plurality of elements includes not only those elements but also includes other elements not expressly listed, or also incudes elements inherent to such a process, method, article, or device. In the absence of further limitation, an element defined by the phrase "including a . . . " does not exclude the presence of additional identical element in the process, method, article, or terminal device.

The solution of the present application is described in detail above. Specific examples are applied to explain the principle and implementation of the present application herein. The above embodiments are only used to help understand the method of the present application and the core idea thereof.

The various embodiments in this specification are described in a progressive manner. Each embodiment focuses on the differences from the other embodiments, and the same or similar parts between the various embodiments may be referred to each other.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it may be understood that the embodiments of the present disclosure may be implemented without those concrete details. In some of the embodiments, well-known processes, structures and techniques are not described in detail, so as not to affect the understanding of the description.

The present disclosure is intended to cover any variations, uses, or adaptive changes of the present disclosure. These variations, uses, or adaptive changes follow the general principles of the present disclosure and include common general knowledge or conventional technical means in the technical field, which are not disclosed herein. The specification and the embodiments are considered as being exemplary only, with a true scope and spirit of the present disclosure being indicated by the following claims.

The invention claimed is:

1. A light-emitting panel, comprising:
a light-emitting substrate comprising a light-emitting area and a non-light-emitting area surrounding the light-emitting area;
a first packaging layer disposed at a light emitting side of the light-emitting substrate;
a low refractive index layer disposed at a side of the first packaging layer away from the light-emitting substrate, the low refractive index layer being arranged around the light-emitting area;
a high refractive index layer disposed at sides of the low refractive index layer and the first packaging layer away from the light-emitting substrate, an orthographic projection of the high refractive index layer on the light-emitting substrate covering the light-emitting area, and the high refractive index layer covering a side surface of the low refractive index layer facing the light-emitting area; and
a second packaging layer disposed at a side of the high refractive index layer away from the light-emitting substrate;
wherein a refractive index of the high refractive index layer is greater than a refractive index of the low refractive index layer, and the side surface of the low refractive index layer facing the light-emitting area contacts with the high refractive index layer to form a first interface, and the first interface is configured for totally reflecting light emitted from the light-emitting area and incident through the high refractive index layer.

2. The light-emitting panel according to claim 1, wherein an included angle between the first interface and a plane where the light-emitting substrate is located is a first included angle, the first included angle being greater than or equal to 50 degrees and less than or equal to 90 degrees and an opening of the first included angle facing away from the light-emitting area.

3. The light-emitting panel according to claim 1, wherein a surface of a side of the high refractive index layer away from the light-emitting substrate is higher than a surface of a side of the low refractive index layer away from the light-emitting substrate, and the surface of the side of the high refractive index layer away from the light-emitting substrate is provided with a digging hole, an orthographic projection of the digging hole on the light-emitting substrate being located within an orthographic projection of the low refractive index layer on the light-emitting substrate;
wherein the refractive index of the second packaging layer is less than the refractive index of the high refractive index layer, and the second packaging layer fills the digging hole, so that the second packaging layer and a hole wall of the digging hole contact with each other to form a second interface.

4. The light-emitting panel according to claim 3, wherein an included angle between the second interface and the plane where the light-emitting substrate is located is a second included angle, the second included angle being greater than or equal to 50 degrees and less than or equal to 130 degrees and an opening of the second included angle facing the light-emitting area.

5. The light-emitting panel according to claim 1, wherein the light-emitting panel comprises a red sub-pixel, a green sub-pixel and a blue sub-pixel, the high refractive index layer comprises a first color film layer, and the first color film layer comprises:
a first red light transmission pattern located in the red sub-pixel for transmitting red light;
a first green light transmission pattern located in the green sub-pixel for transmitting green light; and
a first blue light transmission pattern located in the blue sub-pixel for transmitting blue light.

6. The light-emitting panel according to claim 5, wherein the light-emitting panel further comprises:
a planarization layer disposed at the side of the first packaging layer away from the light-emitting substrate, the low refractive index layer and the first color film layer being both located at a side of the planarization layer away from the light-emitting substrate;
wherein transmittance of the planarization layer is greater than or equal to transmittance of the first color film layer.

7. The light-emitting panel according to claim 6, wherein the light-emitting panel further comprises:
a first light-shielding layer located between the planarization layer and the low refractive index layer, an orthographic projection of the first light-shielding layer on the light-emitting substrate being located within the non-light-emitting area, and the low refractive index layer covering a side surface of the first light-shielding layer facing the light-emitting area.

8. The light-emitting panel according to claim 6, wherein an absolute value of difference between the refractive index of the first packaging layer and a refractive index of the planarization layer is less than or equal to 0.15, and an absolute value of difference between a refractive index of the first color film layer and the refractive index of the planarization layer is less than or equal to 0.15.

9. The light-emitting panel according to claim 1, wherein the light-emitting panel comprises a plurality of sub-pixels with different colors, and the high refractive index layer comprises a transmission film layer, the transmission film layer being made of a same material in different color sub-pixels.

10. The light-emitting panel according to claim 9, wherein the plurality of sub-pixels include a red sub-pixel, a green sub-pixel and a blue sub-pixel, and the light-emitting panel further comprises:
a second color film layer disposed between the transmission film layer and the second packaging layer, or at a side of the second packaging layer away from the light-emitting substrate; wherein the second color film layer comprises:
a second red light transmission pattern located in the red sub-pixel for transmitting red light;
a second green light transmission pattern located in the green sub-pixel for transmitting green light; and a second blue light transmission pattern located in the blue sub-pixel for transmitting blue light.

11. The light-emitting panel according to claim 9, wherein the light-emitting panel further comprises:
a second light-shielding layer located between the first packaging layer and the low refractive index layer, an orthographic projection of the second light-shielding layer on the light-emitting substrate being located within the non-light-emitting area, and the low refractive index layer covering a side surface of the second light-shielding layer facing the light-emitting area.

12. The light-emitting panel according to claim 9, wherein an absolute value of difference between the refractive index of the first packaging layer and a refractive index of the transmission film layer is less than or equal to 0.15.

13. The light-emitting panel according to claim 1, wherein the light-emitting panel further comprises:
a third packaging layer disposed at a side of the second packaging layer away from the light-emitting substrate;
wherein a material of the first packaging layer comprises an inorganic material, a material of the second packaging layer comprises an organic material, and a material of the third packaging layer comprises an inorganic material.

14. The light-emitting panel according to claim 13, wherein the light-emitting panel further comprises:
a touch layer disposed at a side of the third packaging layer away from the light-emitting substrate; and
a cover plate disposed at a side of the touch layer away from the light-emitting substrate.

15. The light-emitting panel according to claim 1, wherein the refractive index of the high refractive index layer is greater than or equal to 1.65 and less than or equal to 1.85; and/or the refractive index of the low refractive index layer is greater than or equal to 1.45 and less than or equal to 1.55.

16. The light-emitting panel according to claim 1, wherein the high refractive index layer is made of at least one of: an organic matrix, zirconia, titanium oxide, a photosensitizer, a dye and a resin; and/or the low refractive index layer is made of at least one of: an organic material doped with photosensitive particles, silicon oxide, silicon nitride and silicon oxynitride.

17. The light-emitting panel according to claim 1, wherein a thickness of the high refractive index layer is greater than or equal to 2 microns and less than or equal to 6 microns; and/or a thickness of the low refractive index layer is greater than or equal to 1 micron and less than or equal to 3 microns.

18. The light-emitting panel according to claim 1, wherein the light-emitting substrate comprises:
a light emitting device located in the light-emitting area, wherein the light emitting device comprises an organic light-emitting diode, a quantum dot light-emitting diode, a mini light-emitting diode or a micro light-emitting diode.

19. A light-emitting apparatus, comprising:
the light-emitting panel according to claim 1;
a driving integrated circuit configured to provide a driving signal to the light-emitting panel; and
a power supply circuit configured to supply power to the light-emitting panel.

20. A manufacturing method of a light-emitting panel, comprising:
providing a light-emitting substrate, the light-emitting substrate comprising a light-emitting area and a non-light-emitting area surrounding the light-emitting area;
forming a first packaging layer at a light emitting side of the light-emitting substrate;
forming a low refractive index layer at a side of the first packaging layer away from the light-emitting substrate, the low refractive index layer being arranged around the light-emitting area;
forming a high refractive index layer at sides of the low refractive index layer and the first packaging layer away from the light-emitting substrate, an orthographic projection of the high refractive index layer on the light-emitting substrate covering the light-emitting area, and the high refractive index layer covering a side surface of the low refractive index layer facing the light-emitting area; and
forming a second packaging layer at a side of the high refractive index layer away from the light-emitting substrate;
wherein a refractive index of the high refractive index layer is greater than a refractive index of the low refractive index layer, and the side surface of the low refractive index layer facing the light-emitting area contacts with the high refractive index layer to form a first interface, and the first interface is configured for totally reflecting light emitted from the light-emitting area and incident through the high refractive index layer.

* * * * *